(12) United States Patent
We et al.

(10) Patent No.: US 9,595,494 B2
(45) Date of Patent: Mar. 14, 2017

(54) SEMICONDUCTOR PACKAGE WITH HIGH DENSITY DIE TO DIE CONNECTION AND METHOD OF MAKING THE SAME

(71) Applicant: QUALCOMM Incorporated, San Diego, CA (US)

(72) Inventors: Hong Bok We, San Diego, CA (US); Dong Wook Kim, San Diego, CA (US); Jae Sik Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/844,185

(22) Filed: Sep. 3, 2015

(65) Prior Publication Data

US 2016/0329284 A1 Nov. 10, 2016

Related U.S. Application Data

(60) Provisional application No. 62/156,857, filed on May 4, 2015.

(51) Int. Cl.
*H01L 23/00* (2006.01)
*H01L 23/538* (2006.01)
(Continued)

(52) U.S. Cl.
CPC ........ *H01L 23/5381* (2013.01); *H01L 21/563* (2013.01); *H01L 21/6835* (2013.01); *H01L 21/76802* (2013.01); *H01L 21/76871* (2013.01); *H01L 21/76879* (2013.01); *H01L 21/76885* (2013.01); *H01L 23/3157* (2013.01); *H01L 23/5383* (2013.01); *H01L 23/5384* (2013.01);
(Continued)

(58) Field of Classification Search
CPC ...................................................... H01L 25/00
See application file for complete search history.

(56) References Cited

U.S. PATENT DOCUMENTS

2012/0261838 A1  10/2012  Braunisch et al.
2013/0187266 A1   7/2013  Chen
(Continued)

FOREIGN PATENT DOCUMENTS

DE  102014108992 A1  12/2014

OTHER PUBLICATIONS

International Search Report and Written Opinion—PCT/US2016/030543—ISA/EPO—Jul. 28, 2016.

*Primary Examiner* — William Harriston
(74) *Attorney, Agent, or Firm* — Muncy, Geissler, Olds & Lowe, P.C.

(57) ABSTRACT

A semiconductor package according to some examples of the disclosure may include a substrate having a bridge embedded in the substrate, a first and second die coupled to the substrate, and a plurality of electrically conductive bridge interconnects in the substrate coupling the bridge to the first and second die. The plurality of electrically conductive bridge interconnects may have a first bridge contact layer directly coupled to the bridge, a first solder layer on the first bridge contact layer, a second bridge contact layer on the first solder layer, a second solder layer on the second bridge contact layer, and a die contact directly coupled to one of the first and second die where the plurality of electrically conductive bridge interconnects are embedded in the substrate.

11 Claims, 11 Drawing Sheets (51) Int. Cl.
*H01L 25/065* (2006.01)
*H01L 25/10* (2006.01)
*H01L 25/00* (2006.01)
*H01L 21/56* (2006.01)
*H01L 21/683* (2006.01)
*H01L 21/768* (2006.01)
*H01L 23/31* (2006.01)

(52) U.S. Cl.
CPC .......... *H01L 23/5386* (2013.01); *H01L 24/19* (2013.01); *H01L 24/25* (2013.01); *H01L 24/27* (2013.01); *H01L 24/33* (2013.01); *H01L 25/0652* (2013.01); *H01L 25/0655* (2013.01); *H01L 25/105* (2013.01); *H01L 25/50* (2013.01); *H01L 24/13* (2013.01); *H01L 2221/68359* (2013.01); *H01L 2224/19* (2013.01); *H01L 2224/221* (2013.01); *H01L 2224/2205* (2013.01); *H01L 2224/24137* (2013.01); *H01L 2224/24226* (2013.01); *H01L 2224/73204* (2013.01); *H01L 2225/06548* (2013.01); *H01L 2225/1023* (2013.01); *H01L 2225/1058* (2013.01); *H01L 2924/1533* (2013.01); *H01L 2924/15311* (2013.01)

(56) References Cited

U.S. PATENT DOCUMENTS

| | | |
|---|---|---|
| 2013/0228932 A1 | 9/2013 | Yu et al. |
| 2014/0035131 A1 | 2/2014 | Noh et al. |
| 2014/0070380 A1 | 3/2014 | Chiu et al. |
| 2014/0117552 A1 | 5/2014 | Qian et al. |
| 2014/0264791 A1 | 9/2014 | Manusharow et al. |
| 2014/0299999 A1 | 10/2014 | Hu et al. |
| 2014/0321091 A1 | 10/2014 | Zhang et al. |
| 2014/0353827 A1 | 12/2014 | Liu et al. |
| 2014/0360759 A1 | 12/2014 | Kunieda et al. |
| 2015/0035148 A1 | 2/2015 | Lee et al. |
| 2015/0061118 A1* | 3/2015 | Chen .................. H01L 24/16 257/737 |
| 2015/0084210 A1* | 3/2015 | Chiu .................. H01L 24/18 257/778 |
| 2015/0116965 A1 | 4/2015 | Kim et al. |
| 2015/0162316 A1* | 6/2015 | Yu .................. H01L 25/105 257/704 |

* cited by examiner

SEMICONDUCTOR PACKAGE WITH HIGH DENSITY DIE TO DIE CONNECTION AND METHOD OF MAKING THE SAME

CROSS-REFERENCE TO RELATED APPLICATION

The present Application for Patent claims the benefit of U.S. Provisional Application No. 62/156,857, entitled "SEMICONDUCTOR PACKAGE WITH HIGH DENSITY DIE TO DIE CONNECTION AND METHOD OF MAKING THE SAME," filed May 4, 2015, assigned to the assignee hereof, and expressly incorporated herein by reference in its entirety.

FIELD OF DISCLOSURE

This disclosure relates generally to a semiconductor package with die to die connections and more specifically to, but not exclusively, semiconductor packages with high density die to die connections.

BACKGROUND

High density die to die connections in a semiconductor package are difficult to manufacture. In order to manufacture a semiconductor package with high density die to die connections, many technical hurdles have to be overcome to create fine line/spacing (L/S). Generally, conventional manufacturing techniques require the generation of an extra layer in the semiconductor package or an interposer to make the high density die to die connections. This extra layer or use of an interposer increases the difficulty and cost of manufacturing over a conventional semiconductor package and results in a package with a large profile not ideally suited for some applications.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a semiconductor package includes: a substrate with a first plurality of vias; a bridge embedded in the substrate; a first die coupled to the substrate; a second die coupled to the substrate and spaced horizontally from the first die; and a plurality of electrically conductive bridge interconnects at least partially in the substrate configured to couple the bridge to the first die and the second die.

In another aspect, a package on package semiconductor package includes: a first package with a third die; and a second package attached to the first package, the second package including: a substrate with a first plurality of vias; a bridge embedded in the substrate; a first die coupled to the substrate; a second die coupled to the substrate and spaced horizontally from the first die; and a plurality of electrically conductive bridge interconnects at least partially in the substrate configured to couple the bridge to the first die and the second die.

In still another aspect, a method for forming a semiconductor package includes: applying a seed layer to a carrier; forming a first routing layer on the seed layer, the first routing layer having a first bridge contact layer; coupling a bridge to the first bridge contact layer; forming a first dielectric layer on the seed layer; removing the carrier and the seed layer; forming a first solder layer on the first bridge contact layer; forming a second bridge contact layer on the first solder layer; the first dielectric layer at least partially encapsulating the first bridge contact layer, the first solder layer, and the second bridge contact layer; forming a second solder layer on the second bridge contact layer and the first routing layer; forming a first die contact layer on the second solder layer; coupling a first die to the first die contact layer; and coupling of a second die to the first die contact layer proximate to the first die and horizontally spaced from the first die.

In still another aspect, a method for forming a semiconductor package includes: applying a seed layer to a carrier; forming a first routing layer on the seed layer, the first routing layer having a first bridge contact layer; coupling a bridge to the first bridge contact layer; forming a first dielectric layer on the seed layer; removing the carrier and the seed layer; forming a first solder layer on the first bridge contact layer; forming a second bridge contact layer on the first solder layer; the first dielectric layer at least partially encapsulating the first bridge contact layer, the first solder layer, and the second bridge contact layer; forming a second solder layer on the second bridge contact layer and the first routing layer; forming a first die contact layer on the second solder layer; coupling a first die to the first die contact layer; and coupling of a second die to the first die contact layer proximate to the first die and horizontally spaced from the first die.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure, and many of the attendant advantages thereof, will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the industry needs, as well as other previously unidentified needs, and mitigate shortcomings of the conventional methods, apparatus, and systems. For example, a lower cost semiconductor package may be manufactured using an embedded trace substrate (ETS) process and a premade bridge for die to die connections. The bridge provides an electrical pathway for logic signals, and may also provide power signals, between the two die so the die can use the electrical pathway provided by the bridge instead of other, potentially longer pathways to route signals from one die to the other die. This will minimize the fine line process due to the bridge already having a fine line design so a cheaper, less complex lithography process can be used. This will also make die to die connections easier and eliminate bridge position errors during the manufacturing process. In addition, a thin package profile (such as that desired for mobile applications) can be achieved by avoiding the use of an interposer and additional substrate. The examples disclosed herein provide a high density bridge inside of an ETS that provides an electrical pathway for die to die connections, a solder connected bridge that allows secure position accuracy, and use of conventional processes for die to die connections.

Figure 1A:
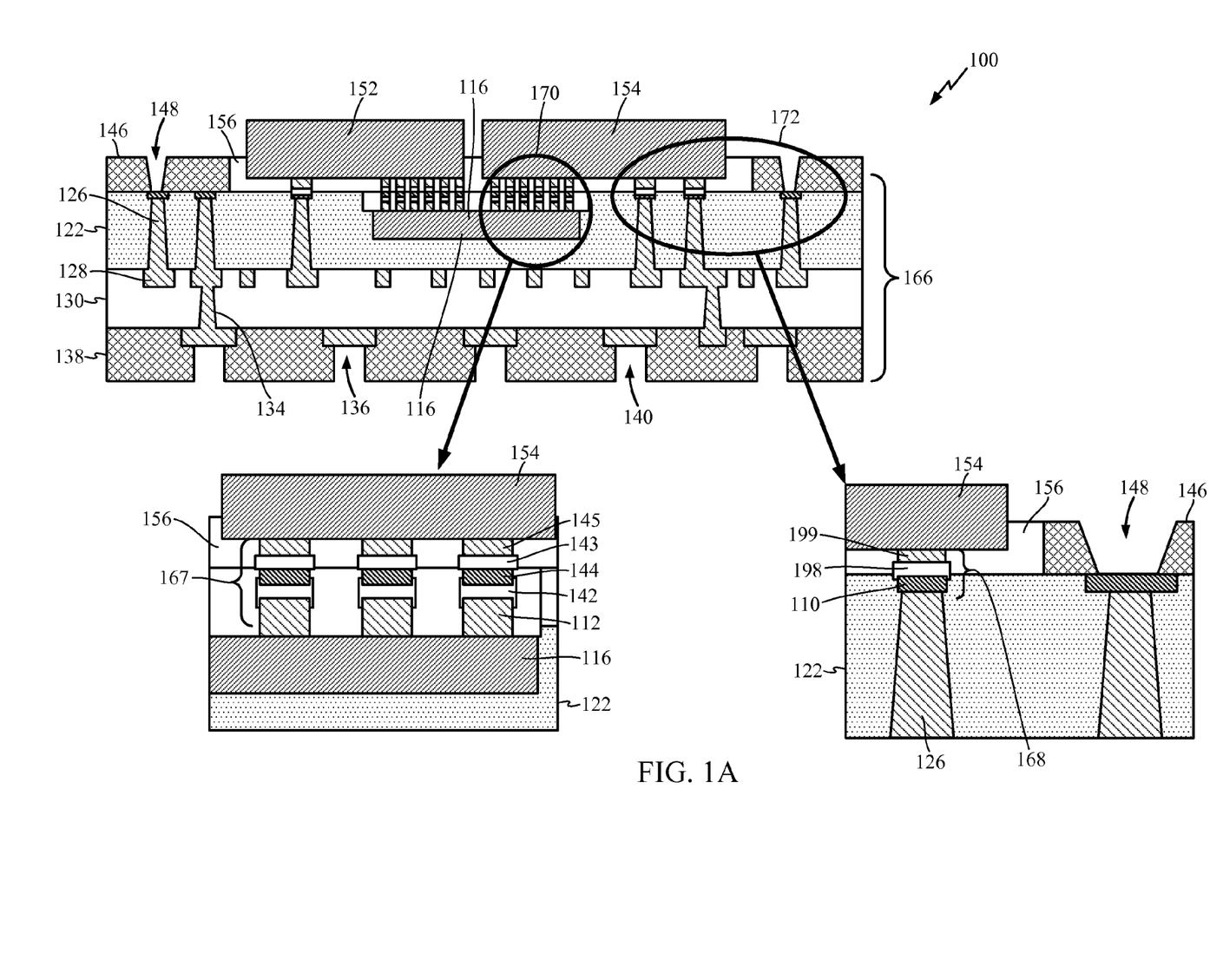
FIG. 1A illustrates a partially exploded side view of a semiconductor package in accordance with some examples of the disclosure.

FIG. 1A illustrates a partially exploded side view of a semiconductor package in accordance with some examples of the disclosure. As shown in FIG. 1, a semiconductor package 100 may include a substrate 166 (e.g. a dielectric, silicon, silicon oxide, aluminum oxide, sapphire, germanium, gallium arsenide, alloy of silicon and germanium, or indium phosphide substrate), a bridge 116 embedded in the substrate 166, a first die 152 coupled to the substrate 166, a second die 154 coupled to the substrate 166 proximate to the first die 152 and spaced horizontally therefrom, a plurality of die interconnects 168 at least partially in the substrate 166 coupled to the first die 152 and the second die 154, and a plurality of electrically conductive bridge interconnects 167 at least partially in the substrate 166 coupled to the bridge 116, the first die 152, and the second die 154. The bridge 116 may be silicon or organic and have a fine pattern design for die to die connections. The bridge 116 may have sub-micron design capability (silicon) or have a minimum 2 um fine pattern design capability (organic). The substrate 166 may include a first dielectric layer 122, a second dielectric layer 130 below the first dielectric layer 122, a third dielectric layer 138 below the second dielectric layer 130 on a bottom of the semiconductor package 100, and a fourth dielectric layer 146 above the first dielectric layer 122 on a top of the semiconductor package 100.

The third dielectric layer 138 may include a third routing layer 136 embedded therein proximate to the second dielectric layer 130 and a first solder joint pattern 140 extending from the third dielectric layer 138 to the third routing layer 136. The second dielectric layer 130 may include a second routing layer 128 embedded therein proximate to the first dielectric layer 122 and a second plurality of vias 134 extending from the third routing layer 136 through the second dielectric layer 130 to the second routing layer 128. The first dielectric layer 122 may include the bridge 116 embedded therein, a first routing layer 110 embedded therein proximate to the fourth dielectric layer 146, and a first plurality of vias 126 extending from the second routing layer 128 through the first dielectric layer 122 to the first routing layer 110. The fourth dielectric layer 146 may include a second solder joint pattern 148 extending from the first routing layer 110 through the fourth dielectric layer 146 to a first surface of the semiconductor package 100, a first under-fill layer 156 having the first die 152 and the second die 154 embedded therein.

FIG. 1A includes a first partial exploded view 170 of the plurality of electrically conductive bridge interconnects 167 and a second partial exploded view 172 of the plurality of die interconnects 168. As seen in the first partial exploded view 170, the plurality of electrically conductive bridge interconnects 167 couple the bridge 116 to the second die 154 and may include a first bridge contact layer 112 directly coupled to the bridge 116, a first solder layer 142 on the first bridge contact layer 112, a second bridge contact layer 144 on the first solder layer 142, a second solder layer 143 on the second bridge contact layer 144, and a first die contact layer 145 directly coupled to the second die 154. The first bridge contact layer 112, the first solder layer 142, and the second bridge contact layer 144 may be embedded in the first dielectric layer 122. The second solder layer 143 and the first die contact layer 145 may be embedded in the fourth dielectric layer 146.

As seen in the second partial exploded view 172, the plurality of die interconnects 168 couple the second die 154 to the first plurality of vias 126 and may include the first routing layer 110 directly coupled to the first plurality of vias 126, a third solder layer 198 on the first routing layer 110, and a second die contact layer 199 directly coupled to the second die 154. The first plurality of vias 126 and the first routing layer 110 may be embedded in the first dielectric layer 122. The third solder layer 198 and the second die contact layer 199 may be embedded in the fourth dielectric layer 146.

Figure 1B:
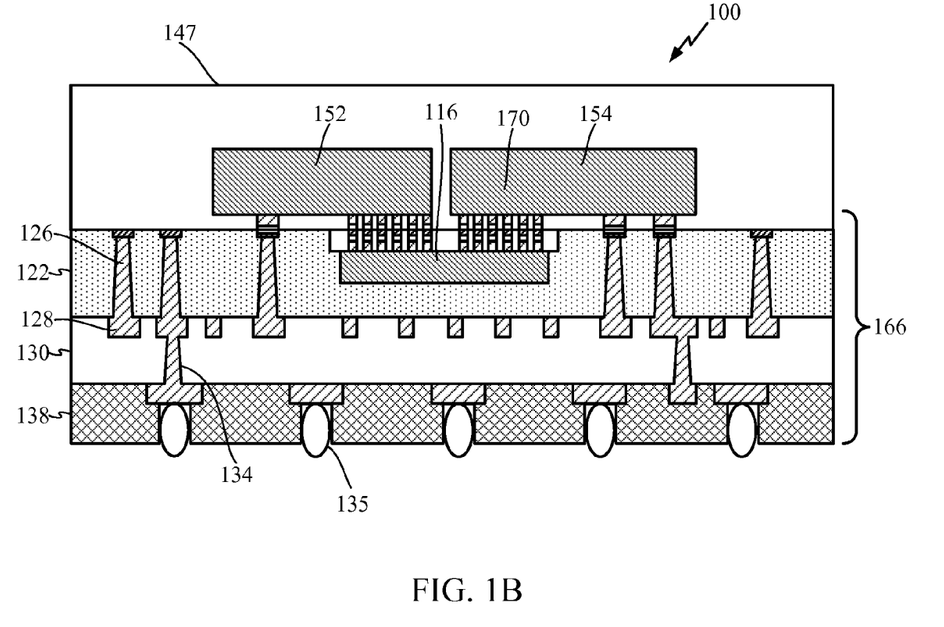
FIG. 1B illustrates a side view of a semiconductor package with two side by side die in accordance with some examples of the disclosure.

FIG. 1B illustrates a side view of a standalone semiconductor package with two side by side die in accordance with some examples of the disclosure. As shown in FIG. 1B, a semiconductor package 100 may include a substrate 166 (e.g. a dielectric, silicon, silicon oxide, aluminum oxide, sapphire, germanium, gallium arsenide, alloy of silicon and germanium, or indium phosphide substrate), a bridge 116 embedded in the substrate 166, a first die 152 coupled to the substrate 166, a second die 154 coupled to the substrate 166 proximate to the first die 152 and spaced horizontally therefrom, a plurality of die interconnects (e.g. die interconnects 168 of FIG. 1A) at least partially in the substrate 166 coupled to the first die 152 and the second die 154, and a plurality of electrically conductive bridge interconnects (e.g. bridge interconnects 167 of FIG. 1A) at least partially in the substrate 166 coupled to the bridge 116, the first die 152, and the second die 154. The substrate 166 may include a first dielectric layer 122, a second dielectric layer 130 below the first dielectric layer 122, a third dielectric layer 138 below the second dielectric layer 130 on a bottom of the semiconductor package 100, a mold compound 147 above the first dielectric layer 122 encapsulating the first die 152 and the second die 154, and a plurality of solder balls 135 on the bottom of the semiconductor package 100 for external connections.

The third dielectric layer 138 may include a third routing layer 136 embedded therein proximate to the second dielectric layer 130 and a first solder joint pattern 140 extending from the third dielectric layer 138 to the third routing layer 136. The second dielectric layer 130 may include a second routing layer 128 embedded therein proximate to the first dielectric layer 122 and a second plurality of vias 134 extending from the third routing layer 136 through the second dielectric layer 130 to the second routing layer 128. The first dielectric layer 122 may include the bridge 116 embedded therein, a first routing layer 110 embedded therein proximate to the mold compound 147, and a first plurality of vias 126 extending from the second routing layer 128 through the first dielectric layer 122 to a first routing layer (e.g. first routing layer 110 of FIG. 1A). The plurality of solder balls may be coupled to the third routing layer 136 and the first solder joint pattern 140.

Figure 2A:
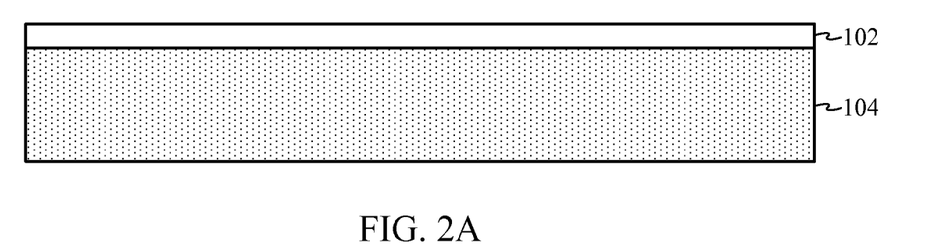
FIGS. 2A-T illustrates an exemplary partial process flow for the manufacture of a semiconductor package in accordance with some examples of the disclosure.
Figure 2B:
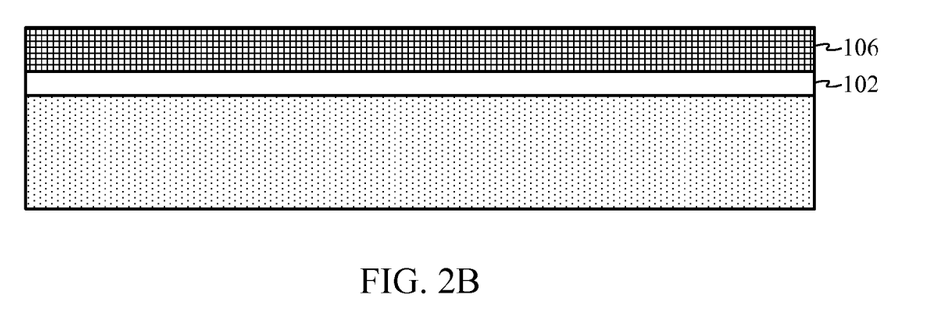
Figure 2C:
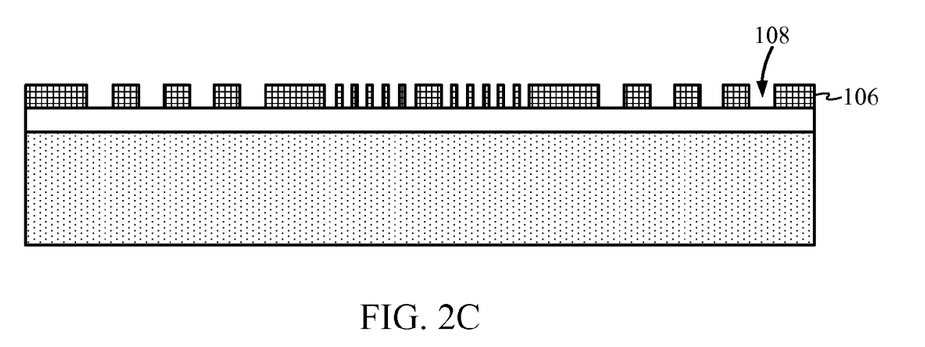
Figure 2D:
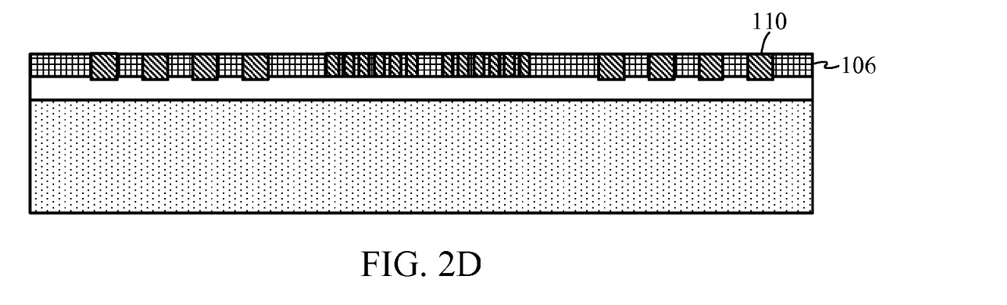
Figure 2E:
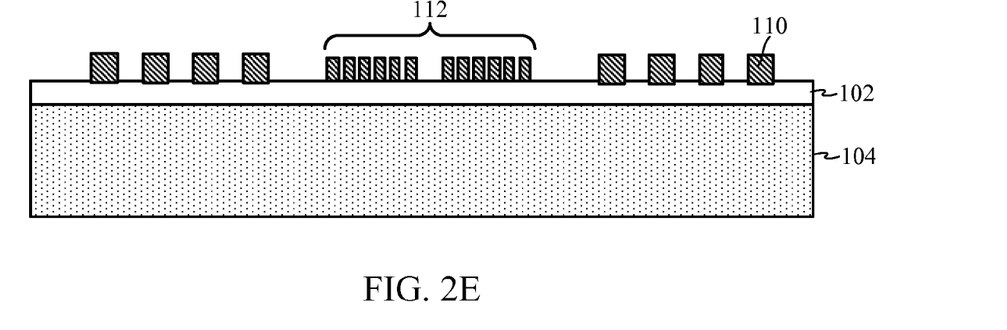

FIGS. 2A-T illustrate an exemplary partial process flow for the manufacture of a semiconductor package 100 in accordance with some examples of the disclosure. As shown in FIG. 2A, the partial process begins with applying a copper seed layer 102 to a carrier 104 (e.g. copper carrier). In FIG. 2B, the process continues with applying a photoresist layer 106 on the copper seed layer 102. In FIG. 2C, a lithographic process is applied to form a first routing layer pattern 108 in the photoresist layer 106. In FIG. 2D a copper plating process is applied to form a first routing layer 110 in the first routing layer pattern 108. In FIG. 2E, the photoresist layer 106 is stripped away exposing the first routing layer 110 that includes a first bridge contact layer 112.

Figure 2F:
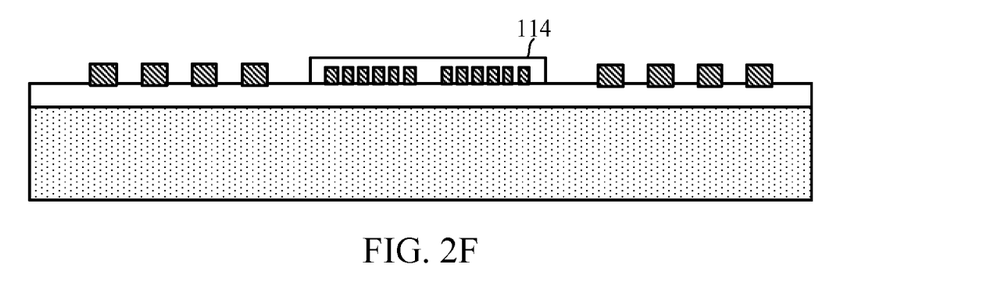
Figure 2G:
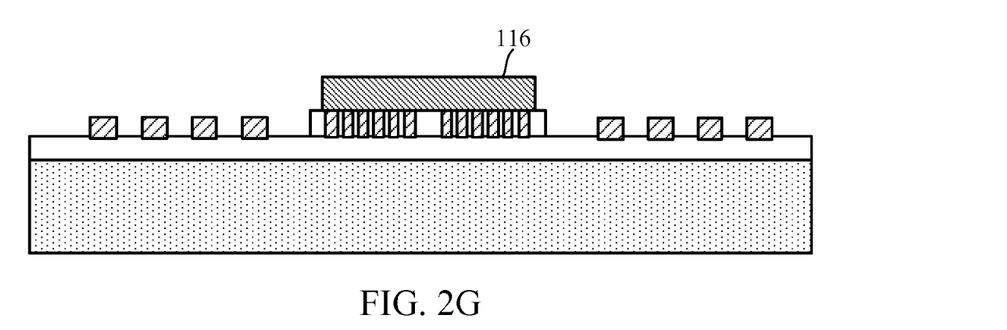
Figure 2H:
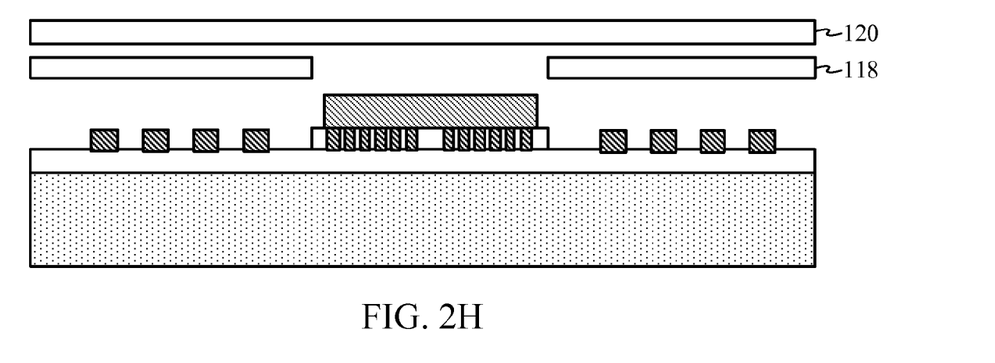
Figure 2I:
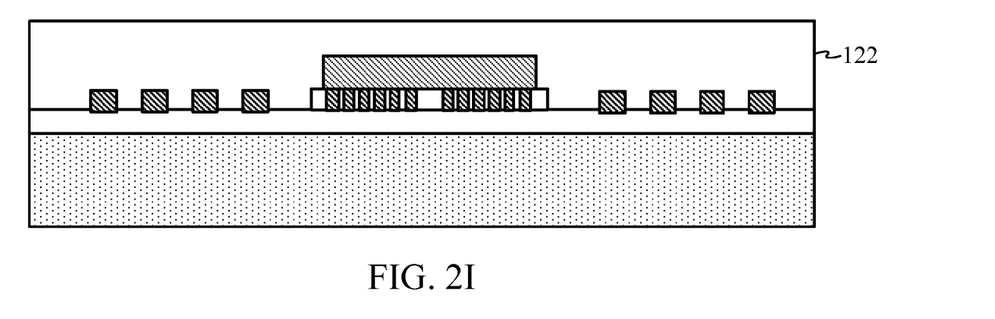

In FIG. 2F, the process continues with the application of a non-conductive paste layer 114 on the first bridge contact layer 112 for attaching a die (see below) on the first bridge contact layer 112. In FIG. 2G, the process continues with coupling of a bridge 116 to the first bridge contact layer 112 on the non-conductive paste layer 114 for TX bonding the die with a copper bump on the first bridge contact layer 112. The bridge 116 may be silicon or organic and have a fine pattern design for die to die connections. The bridge 116 may have sub-micron design capability (silicon) or have a minimum 2 um fine pattern design capability (organic). In FIG. 2H, the process continues with the application of a first lamination layer 118 and a second lamination layer 120. As shown in FIG. 2I, the first lamination layer 118 and the second lamination layer 120 form a first dielectric layer 122.

Figure 2J:
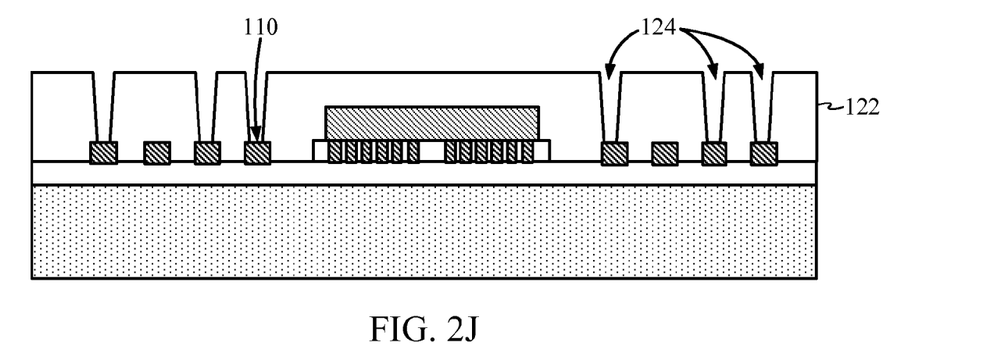
Figure 2K:
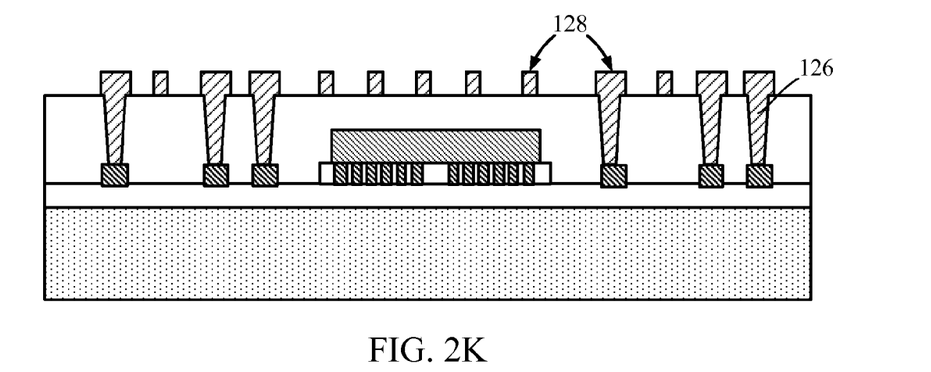
Figure 2L:
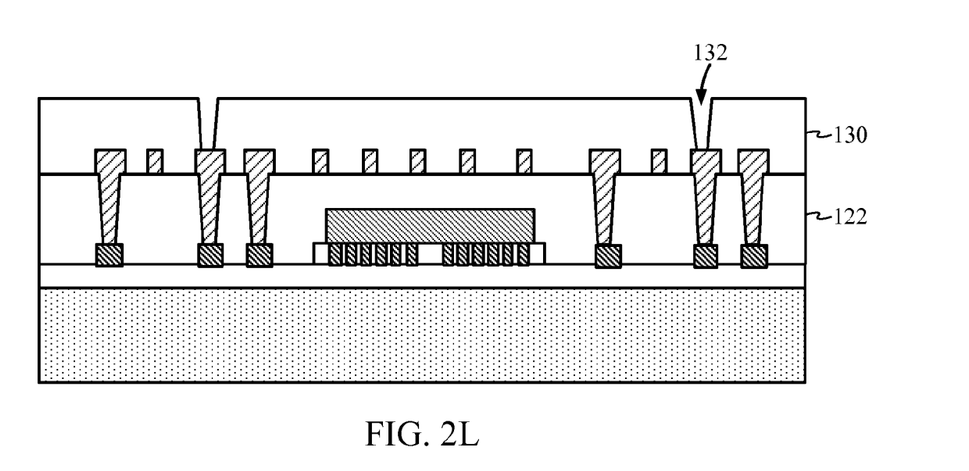
Figure 2M:
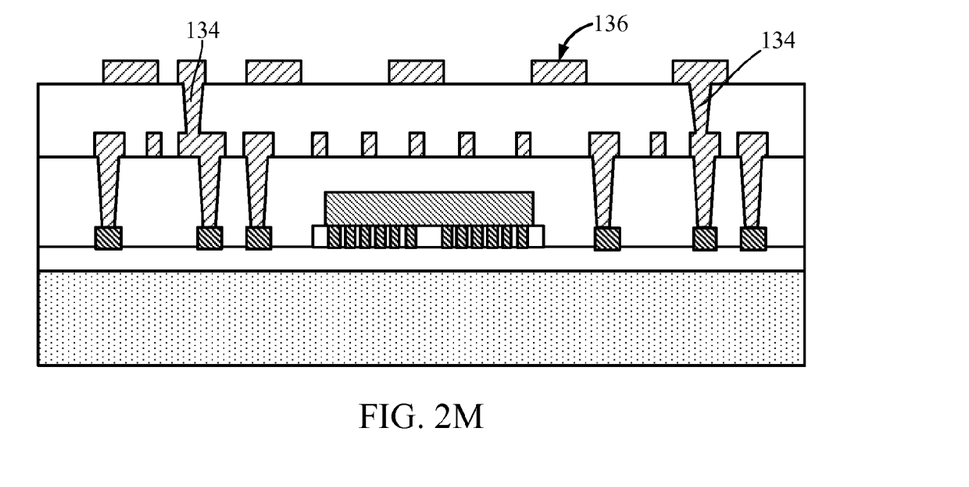

In FIG. 2J, the process continues with etching a first via pattern 124 to either side of the bridge 116 and extending through the first dielectric layer 122 to the first routing layer 110. In FIG. 2K, the process continues with the application of copper in the first via pattern 124 to form a first plurality of vias 126 in addition to a second routing layer 128 on the first dielectric layer 122. In FIG. 2L, a second dielectric layer 130 is formed on the first dielectric layer 122 and a selective etching process is applied to form a second via pattern 132. In FIG. 2M, the process continues with the application of copper in the second via pattern 132 to form a second plurality of vias 134 in addition to a third routing layer 136 on the second dielectric layer 130.

Figure 2N:
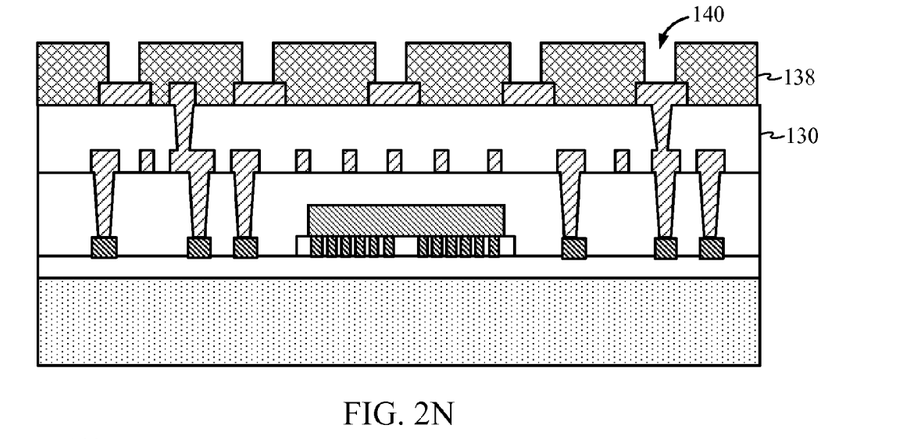
Figure 2O:
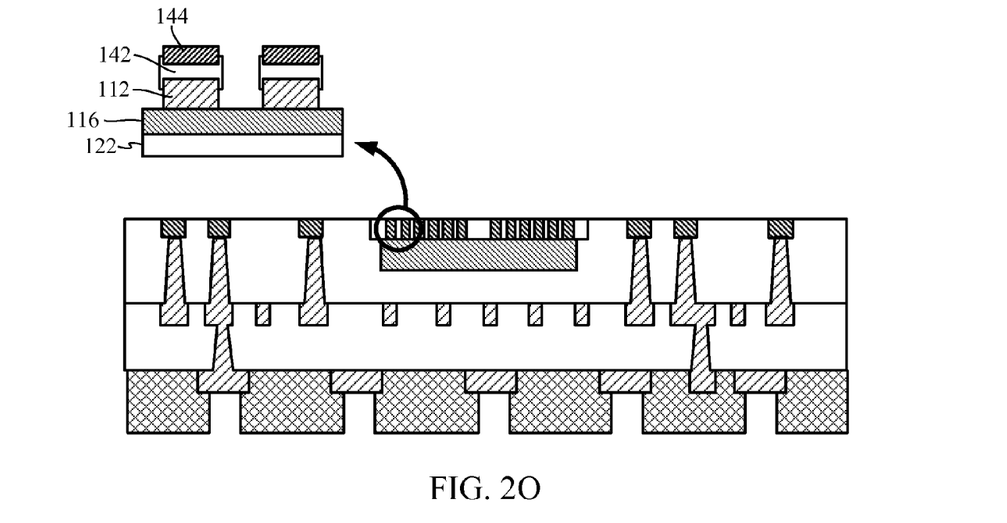

The process continues in FIG. 2N with the application of a third dielectric layer 138 on the second dielectric layer 130 and etching of a first solder joint pattern 140 through the third dielectric layer 138 to the third routing layer 136. FIG. 2O shows the semiconductor package 100 re-oriented but it should be understood that this is for illustrative purposes only and the semiconductor package 100 may remain in the original orientation for the remainder of the manufacturing process. In FIG. 2O, the process continues with the removal of the copper carrier 104 and the copper seed layer 102. The process continues with the application of a first solder layer 142 on the first bridge contact layer 112 followed by the application of a second bridge contact layer 144 on the first solder layer 142.

Figure 2P:
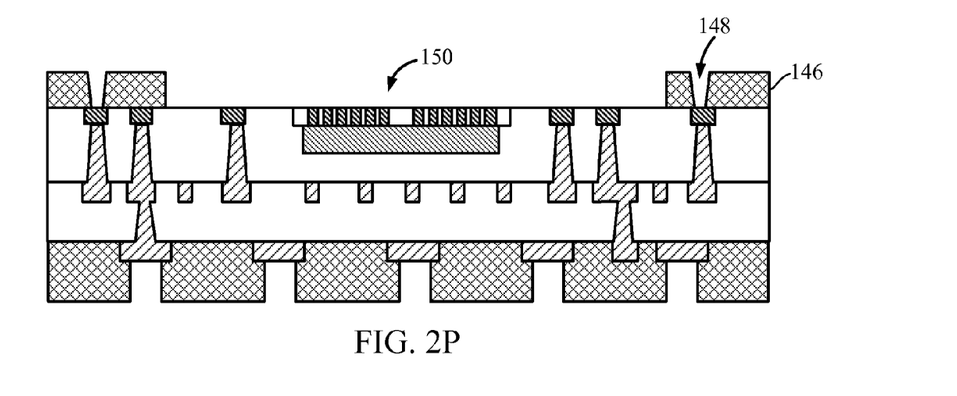
Figure 2Q:
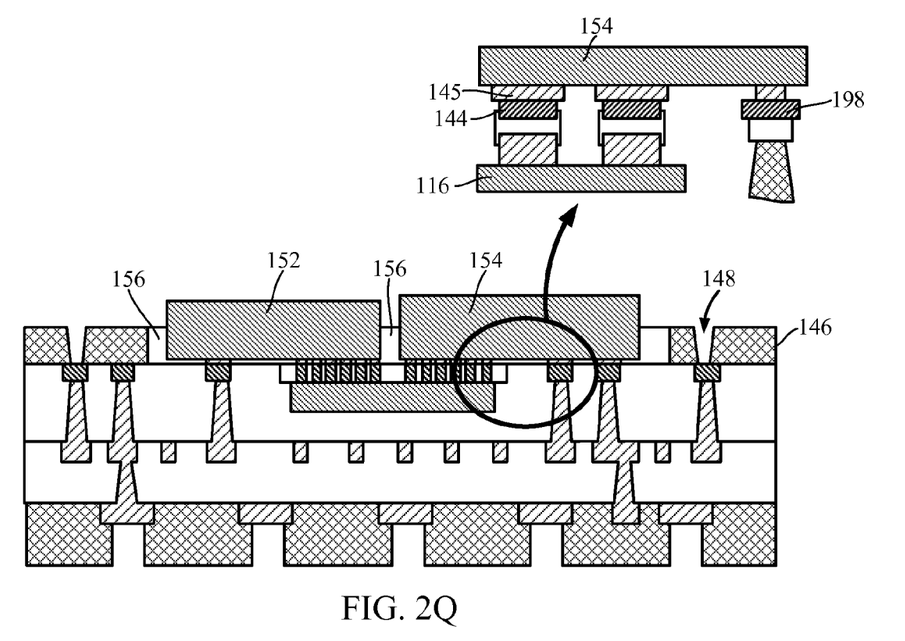

In FIG. 2P, the process continues with the application of a fourth dielectric layer 146 on the first dielectric layer 122 and etching of the fourth dielectric layer 146 to form a second solder joint pattern 148 and a vacant central region 150 over the second bridge contact layer 144. In FIG. 2Q, the process continues with the formation of a second solder layer 143 on the second bridge contact layer 144 and a portion of the first routing layer 110 in the central region 150 followed by the formation of a first die contact layer 145. The process continues with coupling a first die 152 to a portion of the first die contact layer 145 and the coupling of a second die 154 to another portion of the first die contact layer 145 proximate to the first die 152 and horizontally spaced therefrom followed by the application of a first under-fill layer 156.

Figure 2R:
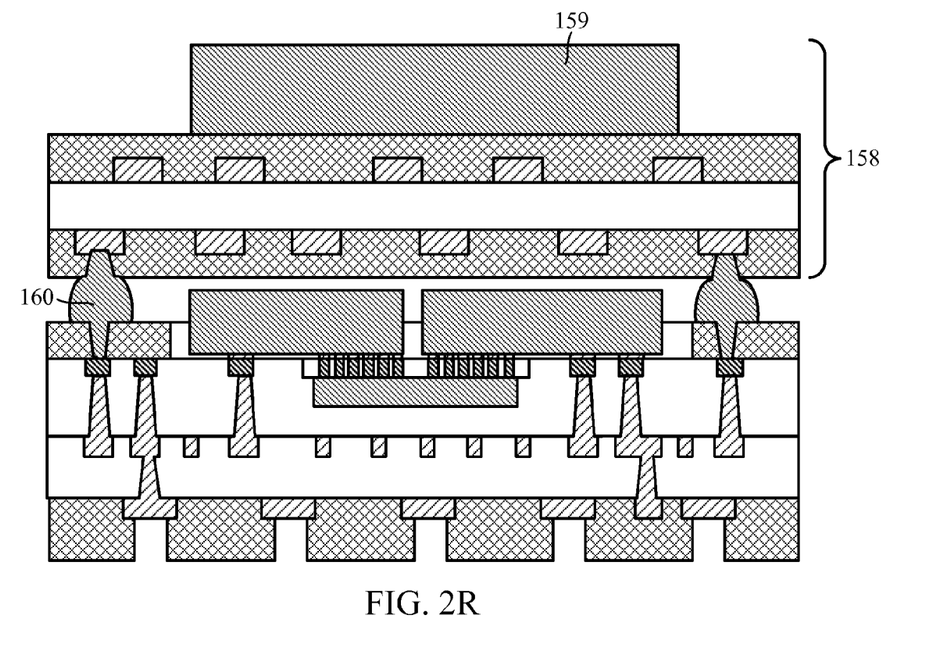
Figure 2S:
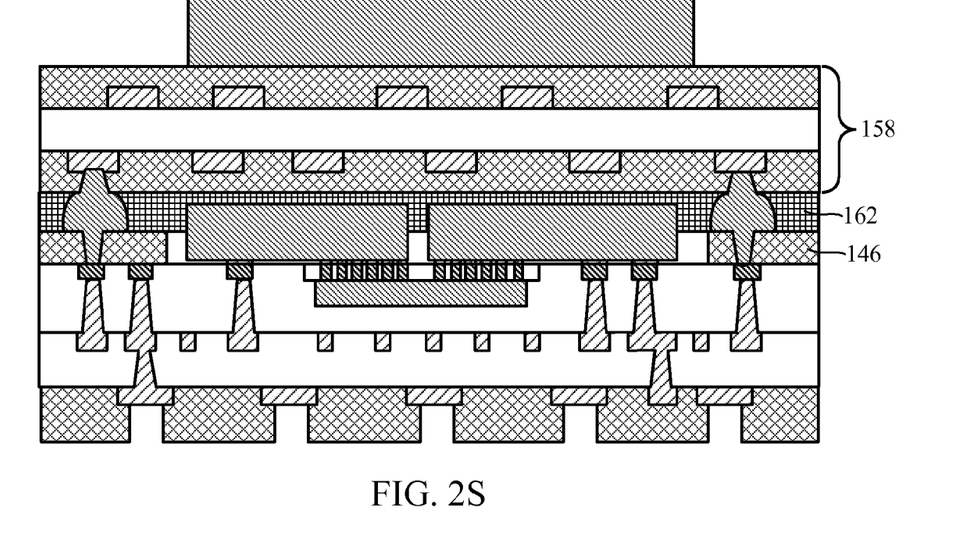
Figure 2T:
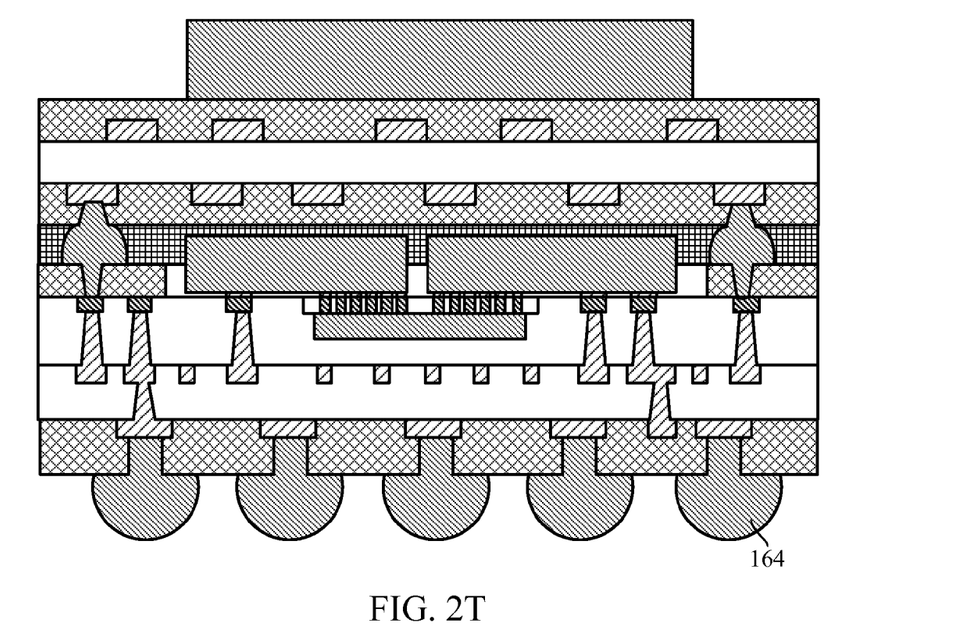

In FIG. 2R, the process continues with the attachment of a first package 158 having a third semiconductor die 159 (that can be a memory, semiconductor die, or an integrated logic chip) and coupled to the first routing layer 110 using a second plurality of solder joints 160 formed in the second solder joint pattern 148 that electrically couples the first package 158 to the first routing layer 110. In FIG. 2S, the process continues with the application of a second under-fill layer 162 between the first package 158 and the fourth dielectric layer 146. In FIG. 2T, the partial process concludes with the formation of a first plurality of solder joints 164 in the first solder joint pattern 140 that electrically couples the third routing layer 136 to the first plurality of solder joints 164.

It should be understood that although the description above mentions a silicon bridge, copper plating, and lead solder material, substitute materials can be used in place of these materials. The substitute materials can include alloys of the above or materials that exhibit similar properties as the above.

Figure 3:
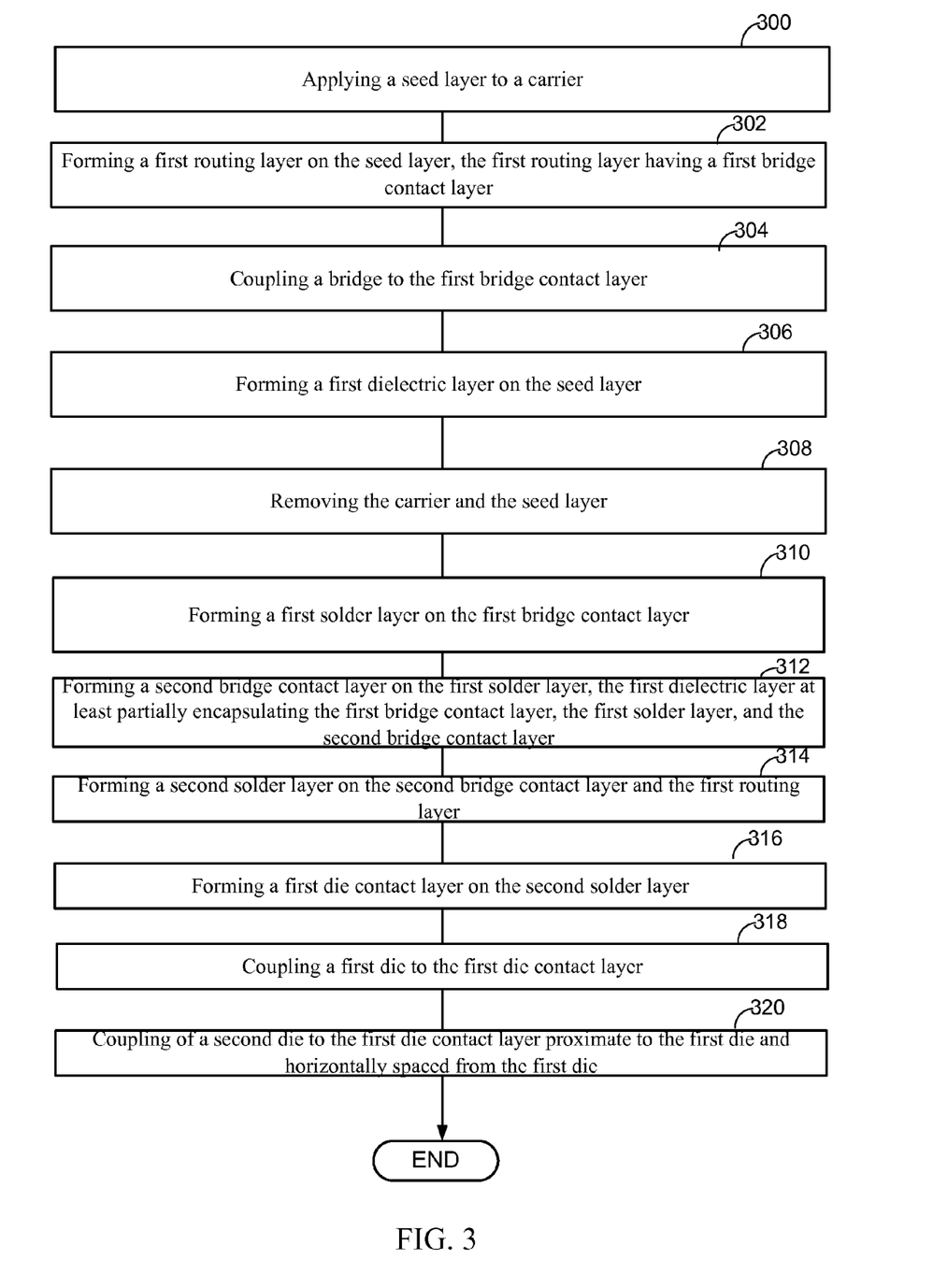
FIG. 3 illustrates an exemplary partial process flow for forming a semiconductor package in accordance with some examples of the disclosure.

Referring now to FIG. 3, a partial process flow for forming a semiconductor package is depicted. As shown in FIG. 3, the partial process flow begins at 300 by applying a seed layer (e.g. a copper seed layer) to a carrier (e.g. a copper carrier). In 302, the process continues with forming a first routing layer on the seed layer and the first routing layer having a first bridge contact layer. In 304, a bridge is coupled to the first bridge contact layer. In 306, the process continues with forming a first dielectric layer on the seed layer. Next in 308, the process continues with removal of the carrier and the seed layer. Then in 310, the process continues with forming a first solder layer on the first bridge contact layer. In 312, the process continues with forming a second bridge contact layer on the first solder layer, the first dielectric layer at least partially encapsulating the first bridge contact layer, the first solder layer, and the second bridge contact layer. Next in 314, the process continues with forming a second solder layer on the second bridge contact layer and the first routing layer. In 316, the process continues with forming a first die contact layer on the second solder layer. Next in 318, the process continues with coupling a first die to the first die contact layer. In 320, the partial process concludes with coupling of a second die to the first die contact layer proximate to the first die and horizontally spaced from the first die.

Figure 4:
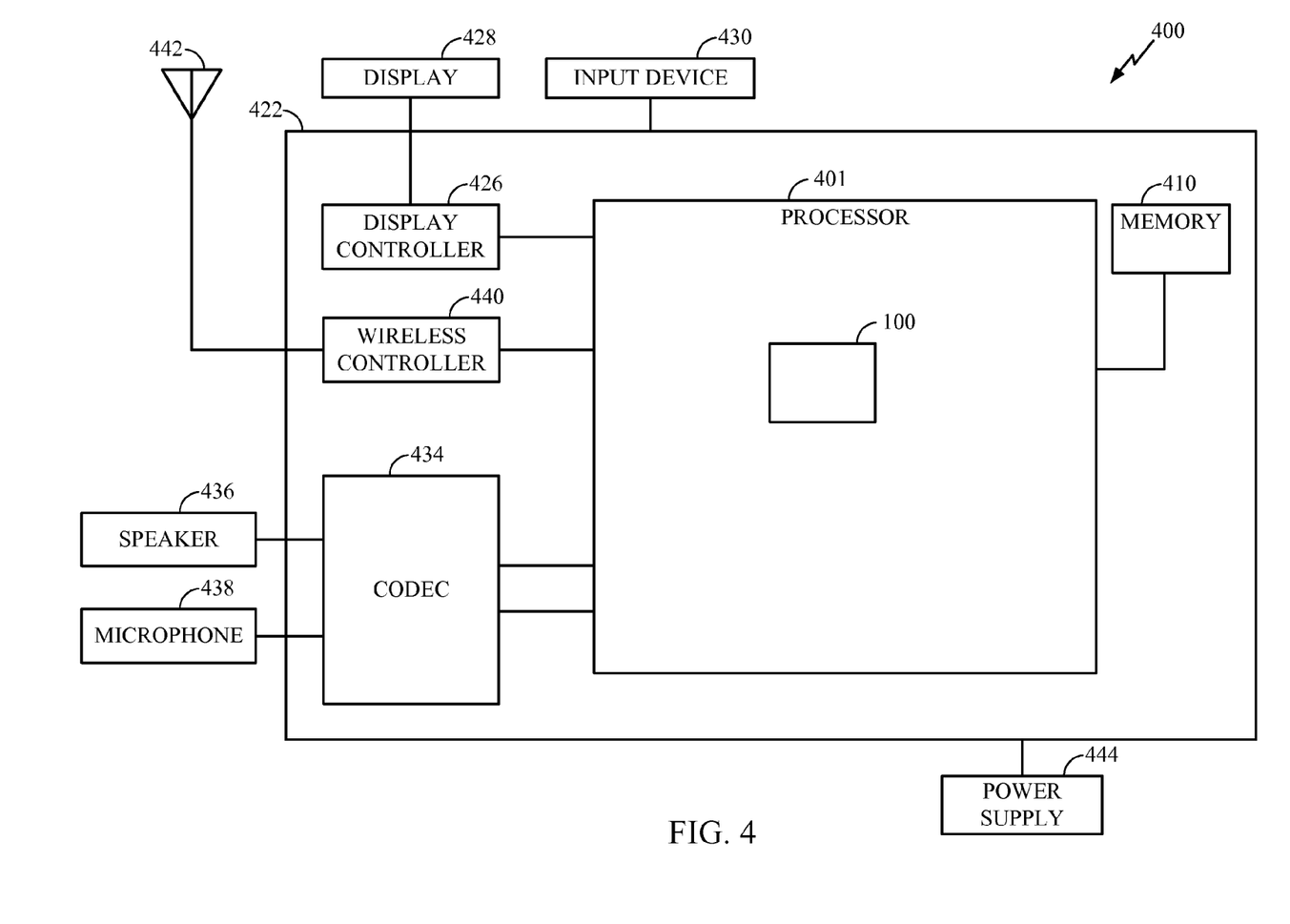
FIG. 4 is an exemplary block diagram of a wireless device including a semiconductor package in accordance with some examples of the disclosure.

Referring now to FIG. 4, a block diagram of a wireless device including a semiconductor package (e.g. semiconductor package 100 as shown in FIGS. 1A and B) is depicted and generally designated 400. Wireless device 400 includes processor 401 having a semiconductor package 100. Processor 401 may be communicatively coupled to memory 410. An instruction cache is not explicitly shown in this view but may be part of processor 401 or may be a separate block coupled between processor 401 and memory 410 as known in the art. FIG. 4 also shows display controller 426 that is coupled to processor 401 and to display 428. Coder/decoder (CODEC) 434 (e.g., an audio and/or voice CODEC) can be coupled to processor 401. Other components, such as wireless controller 440 (which may include a modem) are also illustrated. Speaker 436 and microphone 438 can be coupled to CODEC 434. FIG. 4 also indicates that wireless controller 440 can be coupled to wireless antenna 442. In a particular aspect, processor 401, display controller 426, memory 410, CODEC 434, and wireless controller 440 are included in a system-in-package or system-on-chip device 422.

In a particular aspect, input device 430 and power supply 444 are coupled to the system-on-chip device 422. Moreover, in a particular aspect, as illustrated in FIG. 4, display 428, input device 430, speaker 436, microphone 438, wireless antenna 442, and power supply 444 are external to the system-on-chip device 422. However, each of display 428, input device 430, speaker 436, microphone 438, wireless antenna 442, and power supply 444 can be coupled to a component of the system-on-chip device 422, such as an interface or a controller. It should be noted that although FIG. 4 depicts a wireless communications device, processor 401 and memory 410 may also be integrated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle or other similar devices.

Examples of the methods, apparatus, and systems described herein can be used in a number of applications. Further applications should be readily apparent to those of ordinary skill in the art. For example, semiconductor packages in accordance with this disclosure may be integrated into a variety of devices, such as a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Nothing stated or depicted in this application is intended to dedicate any component, feature, benefit, advantage, or equivalent to the public, regardless of whether the component, feature, benefit, advantage, or the equivalent is recited in the claims.

It should furthermore be noted that methods disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A package, comprising:
   a substrate, the substrate comprises a first plurality of vias;
   a bridge embedded in the substrate;
   a first die coupled to the substrate;
   a second die coupled to the substrate and spaced horizontally from the first die;

a plurality of electrically conductive bridge interconnects at least partially in the substrate configured to couple the bridge to the first die and the second die; and
a plurality of die interconnects configured to couple the first die and the second die to the first plurality of vias, each of the plurality of die interconnects further comprises:
a first routing layer directly coupled to one of the first plurality of vias,
a third solder layer over the first routing layer, and
a second die contact layer over the third solder layer and directly coupled to one of the first die or the second die.

2. The package of claim 1, wherein each of the plurality of electrically conductive bridge interconnects further comprises:
a first bridge contact layer directly coupled to the bridge,
a first solder layer over the first bridge contact layer,
a second bridge contact layer over the first solder layer,
a second solder layer over the second bridge contact layer, and
a first die contact layer over the second solder layer and directly coupled to one of the first die or the second die.

3. The package of claim 1, further comprising:
a first dielectric layer of the substrate configured to encapsulate the bridge and the first routing layer, and at least partially encapsulate the plurality of electrically conductive bridge interconnects and the plurality of die interconnects, the first bridge contact layer, the first solder layer, and the second bridge contact layer; and
a fourth dielectric layer of the substrate above the first dielectric layer and configured to at least partially encapsulate the first die, the second die, the plurality of electrically conductive bridge interconnects, and the plurality of die interconnects, the fourth dielectric layer includes a second solder joint pattern that extends from the first routing layer through the fourth dielectric layer to a first surface.

4. The package of claim 3, wherein the substrate further comprises:
a second dielectric layer below the first dielectric layer, and
a third dielectric layer below the second dielectric layer, the third dielectric layer includes a third routing layer embedded therein proximate to the second dielectric layer and a first solder joint pattern that extends from a second surface through the third dielectric layer to the third routing layer; and
the second dielectric layer includes a second routing layer embedded therein proximate to the first dielectric layer and a second plurality of vias that extends from the third routing layer through the second dielectric layer to the second routing layer.

5. The package of claim 4, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

6. A package on package, comprising:
a first package with a third die; and
a second package attached to the first package, the second package including:
a substrate with a first plurality of vias;
a bridge embedded in the substrate;
a first die coupled to the substrate;
a second die coupled to the substrate and spaced horizontally from the first die;
a plurality of electrically conductive bridge interconnects at least partially in the substrate configured to couple the bridge to the first die and the second die; and
a plurality of die interconnects configured to couple the first die and the second die to the first plurality of vias, each of the plurality of die interconnects further comprises:
a first routing layer directly coupled to one of the first plurality of vias,
a third solder layer over the first routing layer, and
a second die contact layer over the third solder layer and directly coupled to one of the first die or the second die.

7. The package on package of claim 6, wherein each of the plurality of electrically conductive bridge interconnects further comprises:
a first bridge contact layer directly coupled to the bridge,
a first solder layer over the first bridge contact layer,
a second bridge contact layer over the first solder layer,
a second solder layer over the second bridge contact layer, and
a first die contact layer over the second solder layer and directly coupled to one of the first die or the second die.

8. The package on package of claim 6, further comprising:
a first dielectric layer of the substrate configured to encapsulate the bridge and the first routing layer, and at least partially encapsulate the plurality of electrically conductive bridge interconnects and the plurality of die interconnects, the first bridge contact layer, the first solder layer, and the second bridge contact layer; and
a fourth dielectric layer of the substrate above the first dielectric layer and configured to at least partially encapsulate the first die, the second die, the plurality of electrically conductive bridge interconnects, and the plurality of die interconnects, the fourth dielectric layer includes a second solder joint pattern that extends from the first routing layer through the fourth dielectric layer to a first surface.

9. The package on package of claim 8, wherein the substrate further comprises:
a second dielectric layer below the first dielectric layer, and
a third dielectric layer below the second dielectric layer, the third dielectric layer includes a third routing layer embedded therein proximate to the second dielectric layer and a first solder joint pattern that extends from a second surface through the third dielectric layer to the third routing layer; and
the second dielectric layer includes a second routing layer embedded therein proximate to the first dielectric layer and a second plurality of vias that extends from the third routing layer through the second dielectric layer to the second routing layer.

10. The package on package of claim 9, wherein the first package is coupled to the first routing layer and includes a second plurality of solder joints formed in the second solder joint pattern that electrically couples the first package to the first routing layer.

11. The package on package of claim 10, wherein the package on package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

* * * * *